United States Patent
Kawano et al.

(10) Patent No.: US 11,402,443 B2
(45) Date of Patent: Aug. 2, 2022

(54) MAGNETIC CHARACTERISTIC MEASURING APPARATUS AND METHOD

(71) Applicant: FUJITSU LIMITED, Kawasaki (JP)

(72) Inventors: Hiroyasu Kawano, Ebina (JP); Yuji Uehara, Kawasaki (JP); Hirotaka Oshima, Machida (JP)

(73) Assignee: FUJITSU LIMITED, Kawasaki (JP)

( * ) Notice: Subject to any disclaimer, the term of this patent is extended or adjusted under 35 U.S.C. 154(b) by 426 days.

(21) Appl. No.: 16/451,562

(22) Filed: Jun. 25, 2019

(65) Prior Publication Data

US 2020/0011944 A1    Jan. 9, 2020

(30) Foreign Application Priority Data

Jul. 5, 2018 (JP) .............................. JP2018-128547

(51) Int. Cl.
   *G01R 33/12*    (2006.01)
   *G01R 27/26*    (2006.01)

(52) U.S. Cl.
   CPC ............. *G01R 33/12* (2013.01); *G01R 27/26* (2013.01)

(58) Field of Classification Search
   None
   See application file for complete search history.

(56) References Cited

U.S. PATENT DOCUMENTS 5,175,476 A * 12/1992 Anderson .......... H05B 41/2806
315/248

FOREIGN PATENT DOCUMENTS

| JP | 03-221886   | 9/1991 |
|----|-------------|--------|
| JP | 05-172923   | 7/1993 |
| JP | 2005-233818 | 9/2005 |

OTHER PUBLICATIONS

M. Mu et al., "New Core Loss Measurement Method for High-Frequency Magnetic Materials", IEEE Transactions on Power Electronics, vol. 29, No. 8, pp. 4374-4381, Aug. 2014 (8 pages).

D. Hou et al., "New High-Frequency Core Loss Measurement Method With Partial Cancellation Concept", IEEE Transactions on Power Electronics, vol. 32, No. 4, pp. 2987-2994, Apr. 2017 (8 pages).

* cited by examiner

*Primary Examiner* — Patrick Assouad
*Assistant Examiner* — Haidong Zhang
(74) *Attorney, Agent, or Firm* — Fujitsu Patent Center

(57) ABSTRACT

A magnetic characteristic measuring apparatus measures a magnetic characteristic of a sample having a core wound by a primary coil and a secondary coil with high accuracy at high frequency. The apparatus includes: an air-core coil wound by a primary coil and a secondary coil; and a capacitor. The primary coil of the sample, the primary coil of the air-core coil and the capacitor are serially connected, and the capacitance $C_L$ of the capacitor is selected as $1/3\omega^2 L_a \leq C_L \leq 1/\omega^2 L_a$, wherein $L_a$ is an inductance of the air-core coil at a frequency $\omega/2\pi$.

4 Claims, 8 Drawing Sheets

MAGNETIC CHARACTERISTIC MEASURING APPARATUS AND METHOD

CROSS-REFERENCE TO RELATED APPLICATION

This application is based upon and claims the benefit of priority of the prior Japanese Patent Application No. 2018-128547, filed on Jul. 5, 2018, the entire contents of which are incorporated herein by reference.

FIELD

The embodiments discussed herein are related to a magnetic characteristic measuring apparatus and a magnetic characteristic measuring method.

BACKGROUND

With the spread of IoT apparatuses and progress of power electronics, demand has risen for reduction of the size and increase of efficiency of a DC-DC converter that generates a desired direct current (DC) voltage from a DC power supply. Accordingly, highly efficient driving of a DC-DC converter at a higher frequency (1 MHz to 10 MHz) than before has been desired.

In a DC-DC converter, power conversion is performed by a part called a core (magnetic core) made of a magnetic material such as soft ferrite. The efficiency of the DC-DC converter may be increased by highly precisely estimating an energy loss (core loss) occurring in the core during power conversion and thus designing the core and an apparatus based on the estimation result. Because the core loss significantly increases as the driving frequency increases (which is largely influenced by eddy current and a residual loss), the core loss at a high frequency band (1 MHz to 10 MHz) may be required to measure with high precision. Based on the thus acquired core loss, the core or an apparatus is designed.

Such a core loss is generally measured by measuring an exciting current $I_R$ and a secondary voltage $V_2$ that is an induced voltage by using a B-H analyzer.

Japanese Laid-open Patent Publication No. 5-172923, Japanese Laid-open Patent Publication No. 3-221886, and Japanese Laid-open Patent Publication No. 2005-233818 are examples of related art. M. Mu et al., IEEE Trans. Power Electron. Vol. 29, no. 8, pp. 4374-4381, 2014 and D. Hou et al., IEEE Trans. Power Electron. Vol. 32, no. 4, pp. 2987-2994, 2017 are also examples of related art.

However, in a B-H analyzer, as the measuring frequency increases, the phase difference $\theta$ between the exciting current $I_R$ and the secondary voltage $V_2$ increases. In some cases, the phase difference $\theta$ is close to 90°, which results in a significant decrease of the effective power ($I_R V_2 \cos \theta$). For that reason, it is difficult to measure the core loss with high precision.

Therefore, a magnetic measuring module has been demanded which enables measurement of a core loss with high precision even when the measuring frequency is high.

SUMMARY

According to an aspect of the embodiments, an magnetic characteristic measuring apparatus measuring a magnetic characteristic of a sample having a core wound by a primary coil and a secondary coil, the apparatus including: an air-core coil wound by a primary coil and a secondary coil; and a capacitor, wherein the primary coil of the sample, the primary coil of the air-core coil and the capacitor are serially connected, and wherein, in a case where the air-core coil has an inductance $L_a$ at a frequency $\omega/2n$, the capacitor has a capacitance $C_L$ of $1/3\omega^2 L_a \leq C_L \leq 1/\omega^2 L_a$.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Embodiments will be described below. Like numbers refer to like parts throughout, and any repetitive descriptions will be omitted.

First Embodiment

Figure 1:
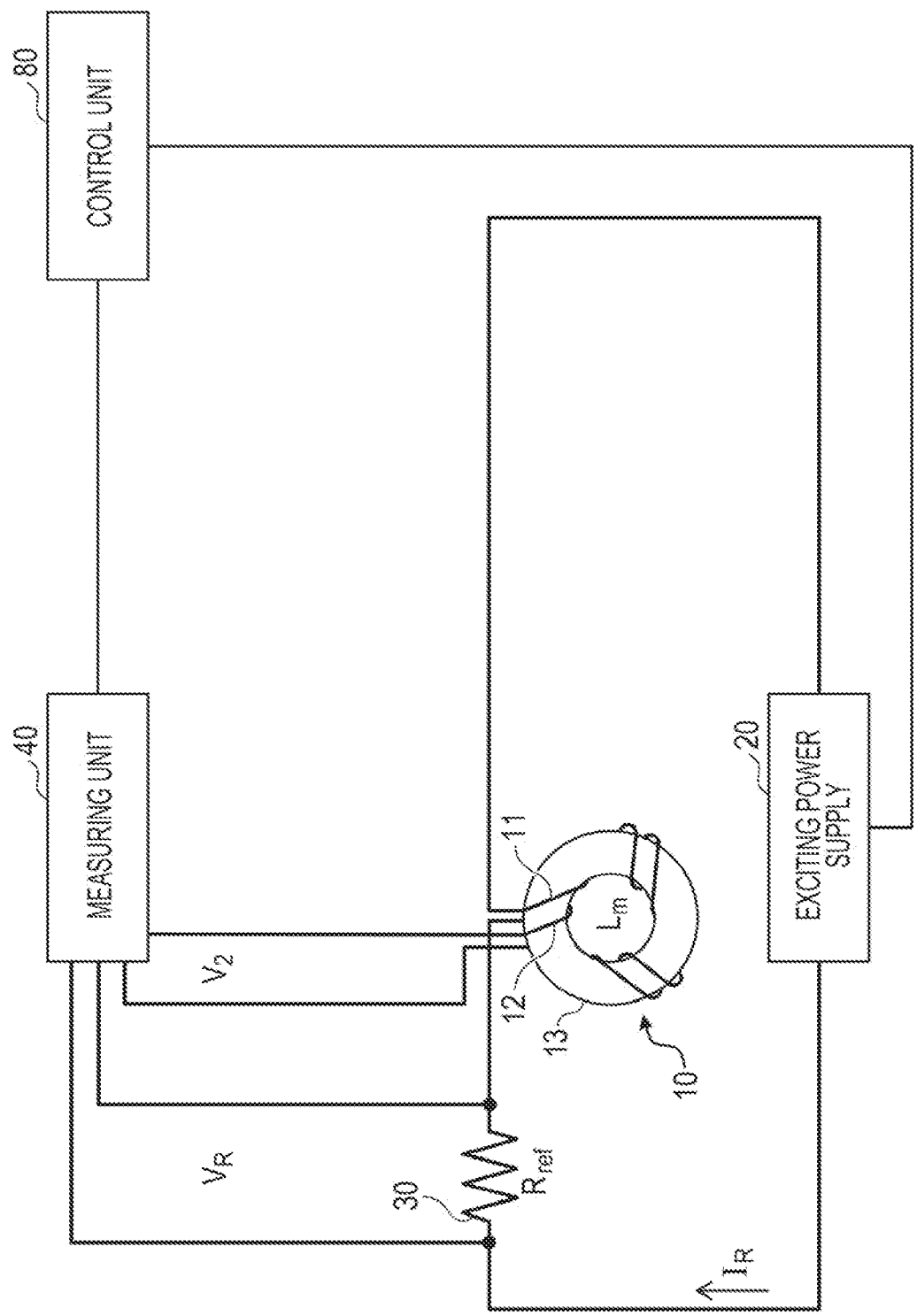
FIG. 1 is a first explanatory diagram of a magnetic characteristic measuring apparatus that measures a core loss.

First, a method for measuring a core loss will be described. As illustrated in FIG. 1, a magnetic characteristic measuring apparatus that measures a core loss of a general sample 10 includes an exciting power supply 20, a current measurement resistance 30, a measuring unit 40 and a control unit 80.

The sample 10 is formed by winding a leading wire to be a primary coil 11 and a leading wire to be a secondary coil 12 around a core 13 made of a magnetic material. The exciting power supply 20 is an alternating-current power supply and may output power by adjusting its amplitude, waveform and frequency.

In the magnetic characteristic measuring apparatus, the current measurement resistance 30 having a resistance value $R_{ref}$ is serially connected to the primary coil 11 of the sample 10, and the exciting power supply 20 is connected to the primary coil 11 and the current measurement resistance 30 that are serially connected. More specifically, for example, one terminal of the current measurement resistance 30 is connected to one terminal of the exciting power supply 20, and one terminal of the primary coil 11 of the sample 10 is connected to the other terminal of the current measurement resistance 30. The other terminal of the primary coil 11 of the sample 10 is connected to the other terminal of the exciting power supply 20. The exciting power supply 20 applies alternating-current voltage to the primary coil 11 and the current measurement resistance 30 that are serially connected as described above.

The measuring unit 40 is an oscilloscope, for example. The one terminal and the other terminal of the secondary coil 12 of the sample 10 and the one terminal and the other terminal of the current measurement resistance 30 are connected to the measuring unit 40. The measuring unit 40 may measure the secondary voltage $V_2$ of the secondary coil 12 and a voltage $V_R$ across the current measurement resistance 30.

The measuring unit 40 is connected to the control unit 80, and information measured by the measuring unit 40 is transmitted to the control unit 80. The control unit 80 is a personal computer, for example, and performs computing operations and controls the magnetic characteristic measuring apparatus. More specifically, for example, the control unit 80 performs computing operations using information measured by the measuring unit 40 and controls the exciting power supply 20 connected to the control unit 80.

In the magnetic characteristic measuring apparatus illustrated in FIG. 1, when the exciting power supply 20 applies alternating-current voltage to the primary coil 11 and the current measurement resistance 30 that are serially connected, a primary current $I_R$ flows through the primary coil 11 and the current measurement resistance 30. When the primary current $I_R$ flows through the current measurement resistance 30, a potential difference occurs across the current measurement resistance 30. A voltage $V_R$ that is the potential difference is measured by the measuring unit 40. When the primary current $I_R$ flows through the primary coil 11 of the sample 10, a secondary current is generated in the secondary coil 12 due to electromagnetic induction. The thus generated secondary voltage $V_2$ is measured by the measuring unit 40.

The core loss of the sample 10 is calculated based on the primary current $I_R$ and the secondary voltage $V_2$. However, when the exciting power supply 20 has a high frequency such as 1 MHz or higher, the phase difference θ between the exciting current $I_R$ and the secondary voltage $V_2$ increases. This significantly reduces the effective power ($I_R V_2 \cos θ$). Thus, it is difficult to measure the core loss with high precision. The "high frequency" herein is a frequency of 1 MHz or higher and, more specifically, for example, a frequency in a range equal to or higher than 1 MHz and equal to or lower than 10 MHz.

Next, details reviewed with regard to the method for measuring a core loss with a high frequency will be described.

Figure 2:
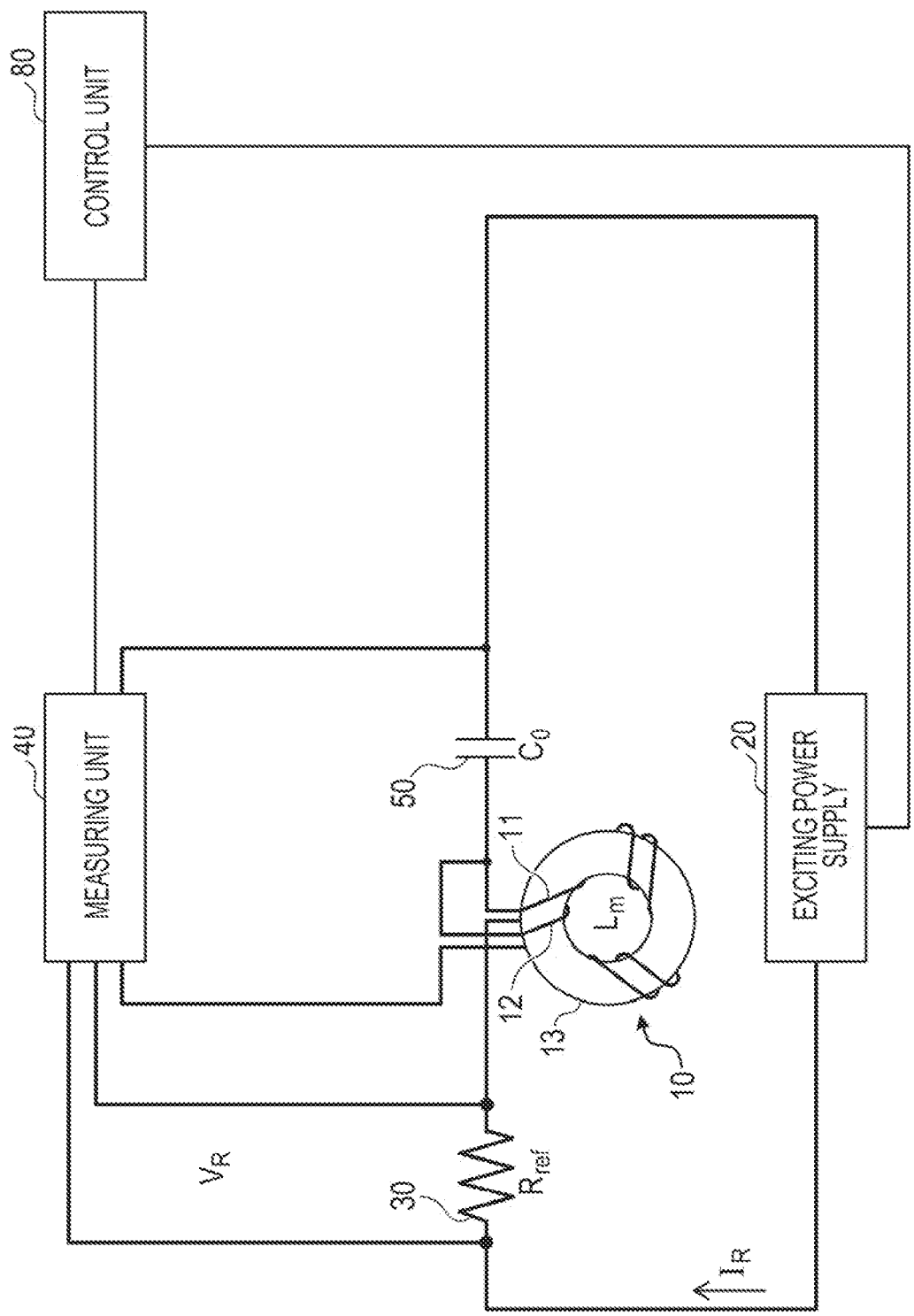
FIG. 2 is a second explanatory diagram of a magnetic characteristic measuring apparatus that measures a core loss.

A magnetic characteristic measuring apparatus illustrated in FIG. 2 has a structure in which a capacitor 50 having a capacitance $C_0$ is connected serially to the primary coil 11 and the secondary coil 12 so that the phase difference θ is equal to 0. The coils and the capacitor are serially connected to cause them to resonate so that the inductive component of the sample 10 may be cancelled by the capacitive component of the capacitor 50. Thus, the phase difference between the primary current $I_R$ and the secondary voltage $V_2$ may be equal to 0, which enables measurement of a precise core loss. However, this method may require the measuring frequency to be a resonance frequency, and it is difficult to arbitrarily set the measuring frequency. Furthermore, there are requirements including a requirement that the alternating current generated in the exciting power supply 20 has sine waves, for example, which lowers versatility.

Figure 3:
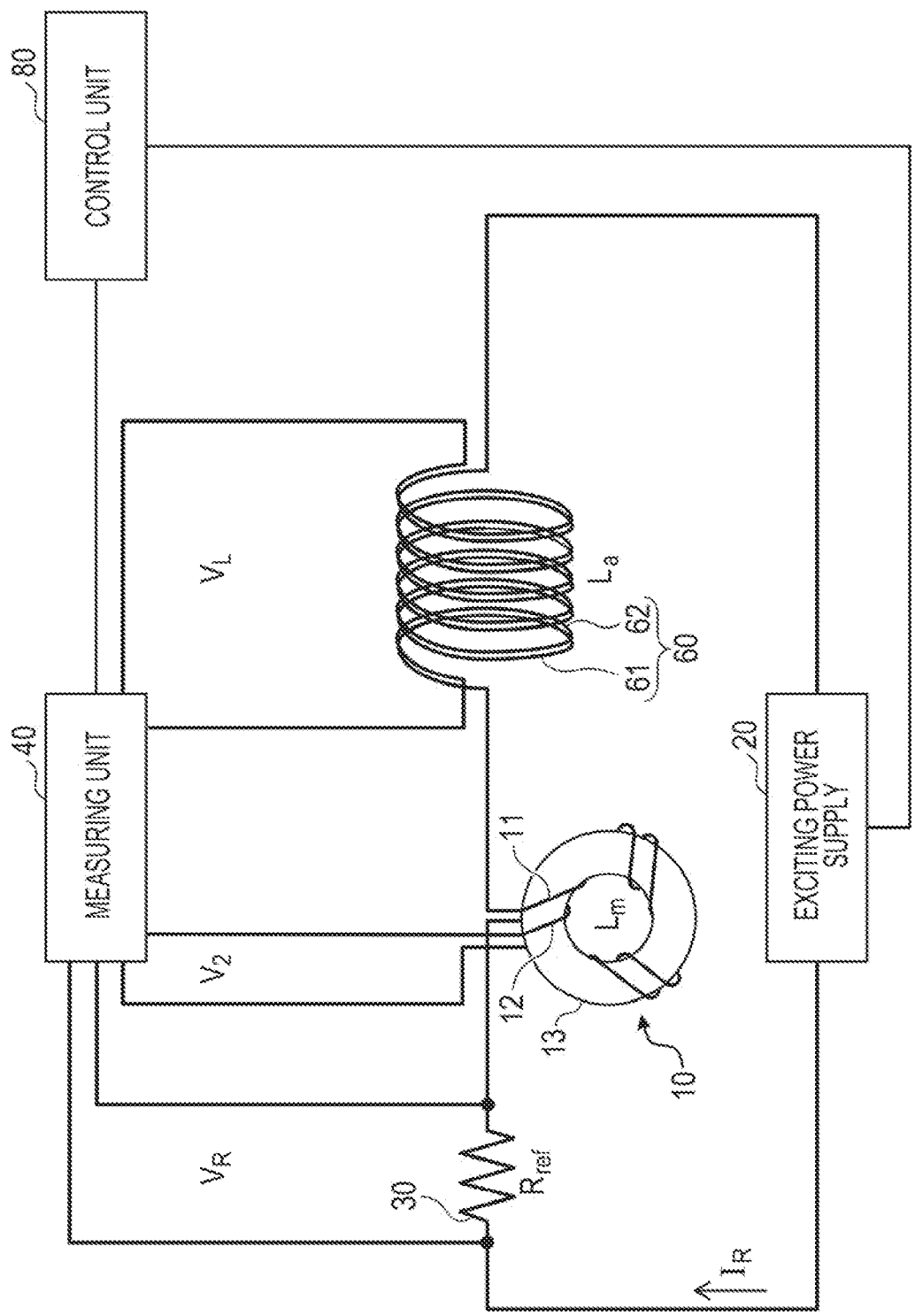
FIG. 3 is a third explanatory diagram of a magnetic characteristic measuring apparatus that measures a core loss.

Next, a magnetic characteristic measuring apparatus illustrated in FIG. 3 has a structure in which a primary coil 61 of an air-core coil 60 is serially connected to the primary coil 11 of the sample 10. The air-core coil 60 is formed by coaxially winding the primary coil 61 and a secondary coil 62. Both ends of the secondary coil 62 of the air-core coil 60 are connected to the measuring unit 40. A precise core loss of the sample 10 may be calculated by connecting the air-core coil 60 as described above, measuring an induced voltage $V_L$ of the secondary coil 62 of the air-core coil 60 and subtracting a loss error generated due to the inductive component therefrom. However, according to this method, because the primary coil of the air-core coil 60 is serially connected to the primary coil 11 of the sample 10, the inductance generated therein increases, resulting in a significantly increased impedance as a whole. Accordingly, the exciting power supply 20 for the driving may be required to be a large-sized one with high power.

A magnetic characteristic measuring apparatus has been demanded that may measure a core loss with high precision without depending on frequencies even when a measuring frequency is high and without requiring a large-sized exciting power supply.

The inventor of the subject application found, as a result of the review, that, when the inductance of the air-core coil 60 was changed, the value of the acquired core loss also changed in the magnetic characteristic measuring apparatus illustrated in FIG. 3. The inventor further found that when the inductance of the air-core coil 60 was equal to the inductance of the sample 10, a core loss might be obtained with significantly high precision. Embodiments are based on the finding by the inventor of the subject application as described above.

Magnetic Measuring Module and Magnetic Characteristic Measuring Apparatus

Figure 4:
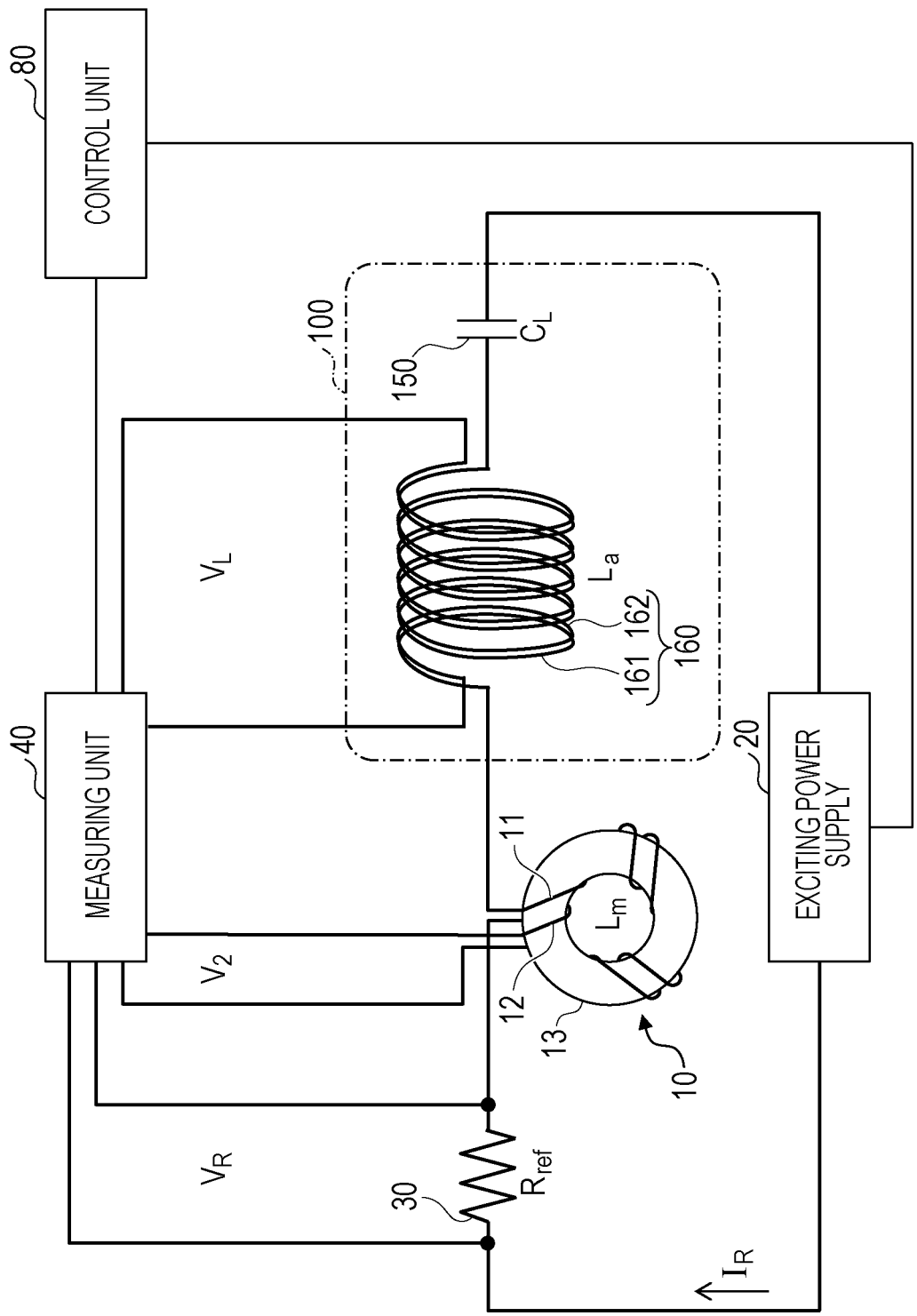
FIG. 4 is an explanatory diagram of a magnetic characteristic measuring apparatus according to a first embodiment.

Next, a magnetic measuring module and a magnetic characteristic measuring apparatus according to the first embodiment will be described. The magnetic characteristic measuring apparatus according to this embodiment is a magnetic characteristic measuring apparatus that measures a core loss of a sample 10 as illustrated in FIG. 4 and includes an exciting power supply 20, a current measurement resistance 30, a measuring unit 40, a capacitor 150, an air-core coil 160 and a control unit 80. The air-core coil 160 has a primary coil 161 and a secondary coil 162 that are coaxially wound. The magnetic measuring module 100 according to this embodiment includes the air-core coil 160 and the capacitor 150. The primary coil 161 of the air-core coil 160 and the capacitor 150 are serially connected.

In the magnetic characteristic measuring apparatus according to this embodiment, the current measurement resistance 30, the primary coil 11 of the sample 10, the primary coil 161 of the air-core coil 160 and the capacitor 150 are serially connected, and the exciting power supply 20 is connected to the serially connected parts. Therefore, one terminal of the current measurement resistance 30 is connected to one terminal of the exciting power supply 20, and one terminal of the primary coil 11 of the sample 10 is connected to the other terminal of the current measurement resistance 30. The other terminal of the primary coil 11 of the sample 10 is connected to one terminal of the primary coil 161 of the air-core coil 160, and one terminal of the capacitor 150 is connected to the terminal of the primary coil 161 of the air-core coil 160. The other terminal of the capacitor 150 is connected to the other terminal of the exciting power supply 20. The exciting power supply 20 applies alternating-current voltage to the current measurement resistance 30, the primary coil 11 of the sample 10, the primary coil 161 of the air-core coil 160 and the capacitor 150 that are serially connected as described above.

The measuring unit 40 is connected to one terminal and the other terminal of the secondary coil 12 of the sample 10, the one terminal and the other terminal of the current measurement resistance 30, and one terminal and the other terminal of the secondary coil 162 of the air-core coil 160. Thus, a secondary voltage $V_2$ of the secondary coil 12 of the sample 10, a voltage $V_R$ across the current measurement resistance 30 and an induced voltage $V_L$ that is a secondary voltage of the secondary coil 162 of the air-core coil 160 may be measured.

According to this embodiment, in a case where the inductance of the sample 10 is $L_m$, the inductance of the air-core coil 160 is $L_a$ and the capacitance of the capacitor 150 is $C_L$, the magnetic characteristic measuring apparatus is formed to satisfy $L_m \approx L_a$ and $C_L = 1/(2\omega^2 L_a)$. In this case, $\omega$ is an angular frequency of a frequency f, and the frequency f is equal to or higher than 1 MHz such as 5 MHz. According to this embodiment, because the capacitor 150 having a capacitance $C_L$ of $1/(2\omega^2 L_a)$ is serially connected, the phase difference θ may be substantially equal to 0 at a predetermined frequency. Thus, occurrence of a high impedance may be suppressed, and the power of the exciting power supply may not be greatly increased. A precise core loss may be calculated by measuring an induced voltage $V_L$ of the secondary coil 162 of the air-core coil 160 and subtracting a loss error generated due to the inductive component therefrom. According to this embodiment, in a case where the frequency f is 5 MHz and the inductance $L_a$ of the air-core coil 160 is 5.0 μH, the capacitance $C_L$ of the capacitor 150 is equal to approximately 100 pF.

Therefore, the magnetic characteristic measuring apparatus according to this embodiment may measure a core loss with high precision without depending on frequencies even when the measuring frequency is high and without requiring a high-power exciting power supply.

Figure 5:
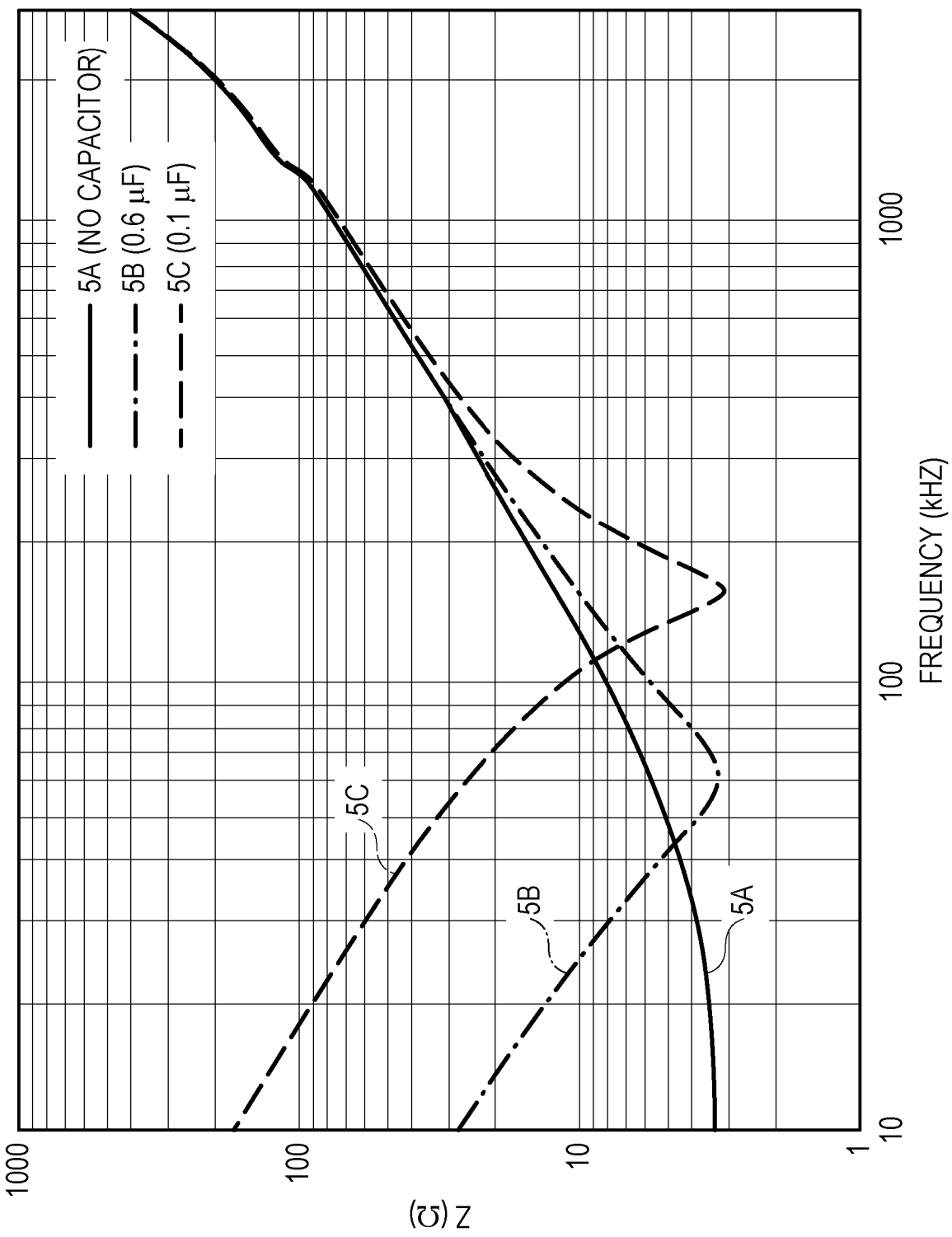
FIG. 5 is an explanatory diagram of a magnetic measuring module according to the first embodiment.

The impedance may be reduced even when the capacitance $C_L$ of the capacitor 150 is accurately equal to $1/(2\omega^2 L_a)$. FIG. 5 illustrates a relationship between frequency and impedance Z in a case where the capacitor 150 is not provided and in a case where the capacitor 150 is connected. FIG. 5 illustrates a characteristic 5A that is a characteristic in a case where the capacitor 150 is not provided and that corresponds to FIG. 3. FIG. 5 further illustrates a characteristic 5B that is a characteristic in a case where the connected capacitor 150 has a capacitance $C_L$ of 0.6 μF and a characteristic 5C that is a characteristic in a case where the connected capacitor 150 has a capacitance $C_L$ of 0.1 μF. The value of the inductance $L_a$ of the air-core coil 160 is 4.6 μH.

As represented by the characteristic 5B in FIG. 5, series connection of the capacitor 150 having a capacitance $C_L$ of 0.6 μF may reduce impedance Z at a frequency of approximately 60 kHz by approximately ½, compared with the characteristic 5A with no capacitor 150. As represented by the characteristic 5C, series connection of the capacitor 150 having a capacitance $C_L$ of 0.1 μF may reduce impedance Z at a frequency of approximately 150 kHz by approximately ¼, compared with the characteristic 5A with no capacitor 150. Although FIG. 5 illustrates a case where the frequency is 10 to 3000 kHz for convenience, the fact that series connection of the capacitor 150 having a capacitance selected properly may reduce the impedance Z is also true in a case where the frequency is as high as 1 MHz or higher.

Next, the range of the capacitance $C_L$ of the capacitor 150 that reduces the impedance Z will be described. In a case where the resistance of the sample 10 is $R_m$ and the inductance of the sample 10 is $L_m$, the impedance $Z_1$ of the sample 10 illustrated in FIG. 1 satisfies the relationship represented by the following expression (1). Because the current measurement resistance 30 has a resistance of approximately 0.5Ω that is sufficiently lower than the resistance $R_m$ of the sample 10 and is ignorable, it is omitted in the following expression (1).

$$|Z_1|^2 = R_m^2 + (\omega L_m)^2 \quad (1)$$

As illustrated in FIG. 4, in a case where the magnetic measuring module 100 is serially connected to the sample 10 and when the inductance of the air-core coil 160 is $L_a$, the square of the impedance $Z_2$, that is, $|Z_2|^2$ is expressed by the following expression (2). Also, when $L_m = L_a$, the following (3) is satisfied. Because the resistance of the air-core coil 160 is sufficiently lower than the resistance $R_m$ of the sample 10 and is ignorable, it is omitted in the expression (2) and the subsequent expressions.

$$|Z_2|^2 = R_m^2 + \{\omega(L_m + L_a) - 1/\omega C_L\}^2 \quad (2)$$

$$|Z_2|^2 = R_m^2 + (2\omega L_a - 1/\omega C_L)^2 \quad (3)$$

If $|Z_2|^2 \leq |Z_1|^2$, from the expressions (1) and (3), the following expression (4) is obtained, and the relationship expressed in the following expression (5) is obtained. Based on $L_m = L_a$, the following expression (6) is obtained.

$$R_m^2 + \{2\omega L_a - 1/\omega C_L\}^2 \leq R_m^2 + (\omega L_m)^2 \quad (4)$$

$$-(2\omega L_a - 1/\omega C_L) \leq \omega L_m \leq (2\omega L_a - 1/\omega C_L) \quad (5)$$

$$\tfrac{1}{3}\omega^2 L_a \leq C_L \leq 1/\omega^2 L_a \quad (6)$$

Therefore, the capacitance $C_L$ of the capacitor 150 may satisfy the expression (6).

Method for Manufacturing Magnetic Measuring Module

Figure 6:
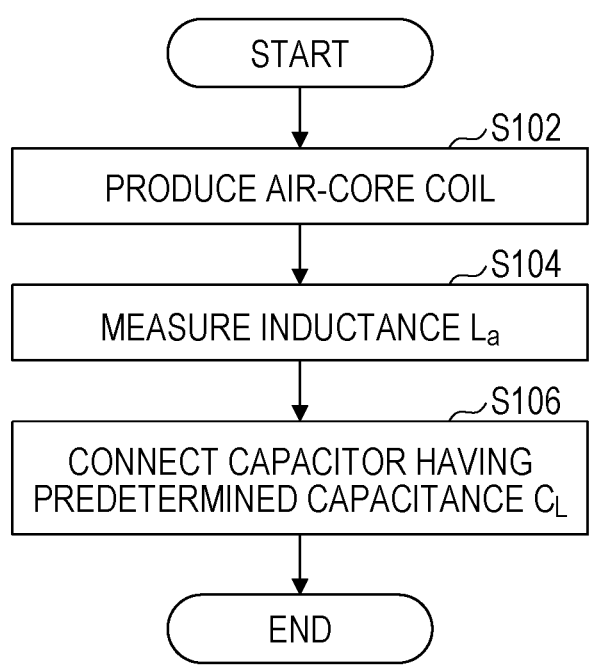
FIG. 6 is a flowchart illustrating a manufacturing method for the magnetic measuring module according to the first embodiment.

Next, a method for manufacturing the magnetic measuring module 100 according to this embodiment will be described with reference to FIG. 6.

First, as indicated in step 102 (S102), the air-core coil 160 is produced by placing two coated leading wires in parallel and winding them helically around a column or a tube made of a nonmagnetic and insulative material such as a resin material. The number of turns of the two helically wound coated leading wires is in a range of 30 to 40, for example. Thus, the air-core coil 160 is produced in which one of the two coated leading wires is the primary coil 161 and the other one is the secondary coil 162.

Next, as indicated in step 104 (S104), the inductance $L_a$ of the air-core coil 160 is measured. More specifically, for example, a measuring apparatus such as an LCR meter is used to measure the inductance $L_a$ of the air-core coil 160 at a frequency f ($=\omega/2\pi$).

Next, as indicated in step 106 (S106), the capacitor 150 having a capacitance $C_L$ that satisfies $\tfrac{1}{3}\omega^2 L_a \leq C_L \leq 1/\omega^2 L_a$ is serially connected to the primary coil 161 of the air-core coil 160.

Through these processes, the magnetic measuring module 100 according to this embodiment may be manufactured.

Magnetic Characteristic Measuring Method

Figure 7:
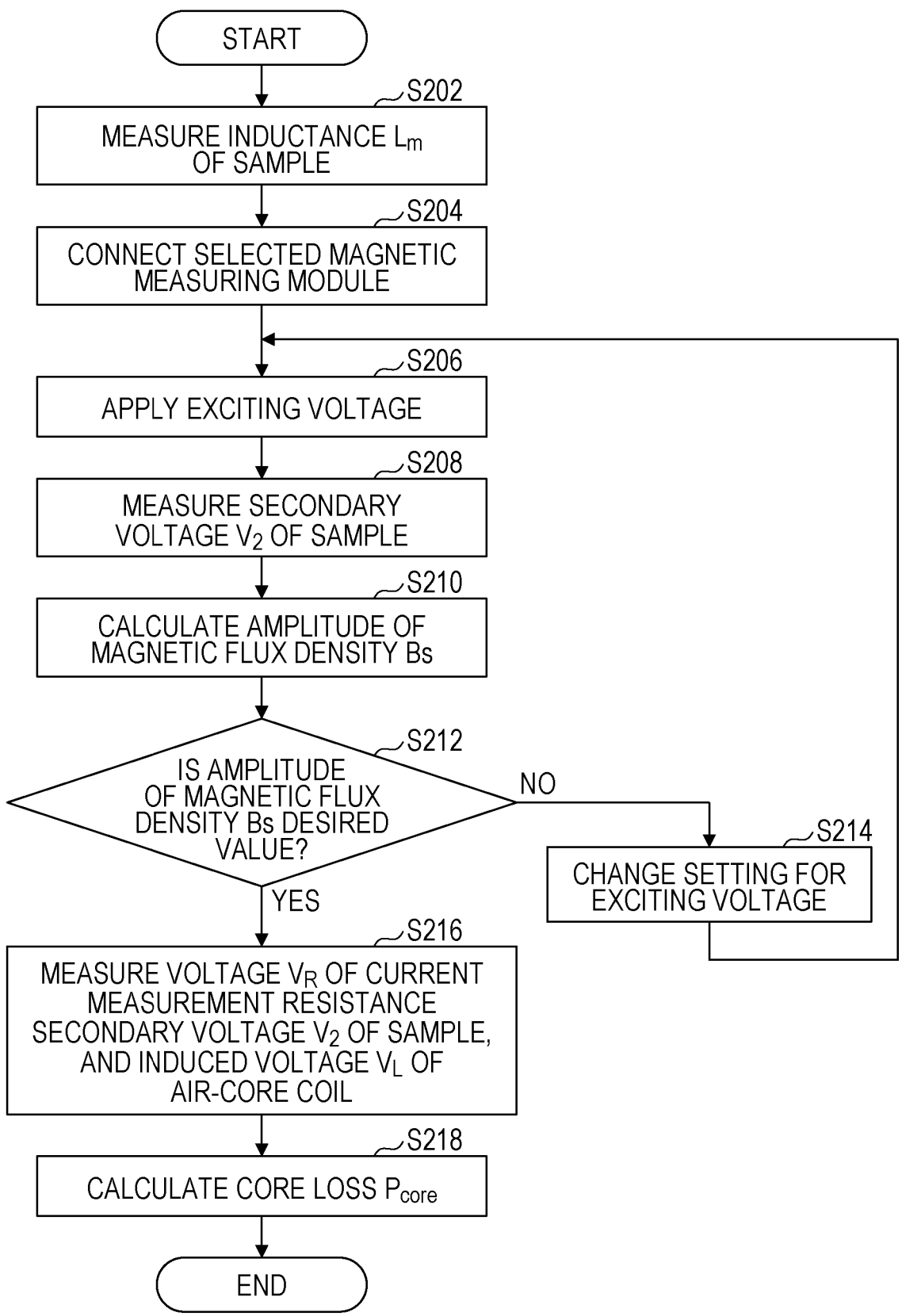
FIG. 7 is a flowchart illustrating a magnetic characteristic measuring method according to the first embodiment.

Next, a magnetic characteristic measuring method according to this embodiment will be described with reference to FIG. 7. In the magnetic characteristic measuring method according to this embodiment, the controls and computing in the magnetic characteristic measuring apparatus are performed by the control unit 80.

First, as indicated in step 202 (S202), the inductance of the sample 10 is measured. More specifically, for example, a measuring apparatus such as an LCR meter is used to measure the inductance $L_m$ of the sample 10 at a frequency for measuring a core loss.

Next, as indicated in step 204 (S204), the corresponding magnetic measuring module 100, that is, the magnetic measuring module 100 having an inductance $L_a$ having a value close to that of the inductance $L_m$ of the sample 10 at the frequency for measuring a core loss is selected and is connected to the sample 10. The magnetic measuring module 100 is connected such that the primary coil 11 of the sample 10, the primary coil 161 of the air-core coil 160 and the capacitor 150 of the magnetic measuring module 100 are serially connected.

As indicated in step 206 (S206), the exciting power supply 20 applies alternating-current exciting voltage at the measuring frequency to the sample 10 and the magnetic measuring module 100 that are serially connected.

Next, as indicated in step 208 (S208), the secondary voltage $V_2$ of the secondary coil 12 of the sample 10 is measured.

Next, as indicated in step 210 (S210), the amplitude of a magnetic flux density Bs is calculated from the secondary voltage $V_2$ of the secondary coil 12 of the sample 10 acquired in step 208. More specifically, for example, because, if the magnetic flux is φ, $V_2=-dφ/dt$, $V_2$ is integrated to calculate the magnetic flux φ. Furthermore, because, if the cross-sectional area of the core 13 of the sample 10 is S, Bs=φ/S, the amplitude of the magnetic flux density Bs is calculated.

Next, as indicated in step 212 (S212), whether the amplitude of the magnetic flux density Bs has a desired value or not is determined. This determination is performed because a core loss is measured when the amplitude of the magnetic flux density Bs has a target desired value. If the amplitude of the magnetic flux density Bs does not have a desired value, the processing moves to step 214. If the amplitude of the magnetic flux density Bs has a desired value, the processing moves to step 216.

In step 214 (S214), the setting for the exciting voltage at the exciting power supply 20 is changed. Then, the processing moves to step 206, and the operations from step 206 to step 212 are repeated.

On the other hand, in step 216 (S216), the voltage $V_R$ across the current measurement resistance 30, the secondary voltage $V_2$ of the secondary coil 12 of the sample 10, and the induced voltage $V_L$ of the secondary coil 162 of the air-core coil 160 in the magnetic measuring module 100 are measured.

Next, as indicated in step 218 (S218), the core loss $P_{core}$ is calculated. The core loss $P_{core}$ is calculated by the following expression based on the voltage $V_R$, the secondary voltage $V_2$ of the secondary coil 12 of the sample 10, and the induced voltage $V_L$ of the secondary coil 162 in the magnetic measuring module 100 that are measured in step 216. In this case, k is a proportionality factor.

$$P_{core} = \int V_2 \cdot \frac{V_R}{R_{ref}} - \frac{1}{k} \int V_L \cdot \frac{V_R}{R_{ref}}$$

Through the operations above, the core loss $P_{core}$ of the sample 10 may be acquired.

Second Embodiment

Next, a magnetic characteristic measuring apparatus according to a second embodiment will be described. As described above, the inventor of the subject application found that a significantly highly precise core loss may be acquired with the inductance $L_a$ of the air-core coil 60 equal to the inductance $L_m$ of the sample 10. According to this embodiment, with the value of the inductance $L_a$ of the air-core coil 60 in a predetermined range, a core loss of the sample 10 with a less error is calculated. This is applicable when the power of the exciting power supply 20 may not be considered.

The inventor of the subject application investigated a relationship between a core loss of the sample 10 and the inductance $L_a$ of the air-core coil 60 in the magnetic characteristic measuring apparatus illustrated in FIG. 3. More specifically, for example, the sample 10 having an inductance $L_m$ of 5.0 μH was used to measure a core loss of the sample 10 against different inductances $L_a$ of the air-core coil 60. Table 1 illustrates the measurement results. The reference core loss of the sample 10 was a core loss having a value of 2850 J/m³ acquired by measuring the core loss in advance by using the magnetic characteristic measuring apparatus illustrated in FIG. 2. The alternating-current frequency output by the exciting power supply 20 is 5 MHz.

TABLE 1

| Inductance $L_a$ of Air-Core Coil (μH) | Percentage (%) against Inductance $L_m$ of Sample | Core Loss (J/m³) of Sample | Error (%) |
| --- | --- | --- | --- |
| 5.49 | 109.8 | 2975 | +4.4 |
| 5.38 | 107.6 | 2750 | −3.5 |
| 5.27 | 105.4 | 2960 | +3.9 |
| 5.22 | 104.4 | 2905 | +1.9 |
| 5.13 | 102.6 | 2920 | +2.5 |
| 5.05 | 101.0 | 2890 | +1.4 |
| 5.00 | 100.0 | 2860 | +0.4 |
| 4.95 | 99.0 | 2810 | −1.4 |
| 4.86 | 97.2 | 2870 | +0.7 |
| 4.77 | 95.4 | 2770 | −2.8 |
| 4.68 | 93.6 | 2700 | −5.3 |
| 4.63 | 92.6 | 2730 | −4.2 |
| 4.50 | 90.0 | 2735 | −4.0 |

Inductance $L_m$ of Sample: 5.0 μH
Core Loss of Sample: 2850 (J/m³)

As illustrated in Table 1, when the air-core coil 60 had an inductance $L_a$ of 5.49 μH (with a percentage of 109.8% against the inductance $L_m$ of the sample 10), the obtained value of the core loss of the sample 10 was 2975 J/m³ with an error of +4.4%. When the air-core coil 60 had an inductance $L_a$ of 5.38 μH (with a percentage of 107.6% against the inductance $L_m$ of the sample 10), the obtained value of the core loss of the sample 10 was 2750 J/m³ with an error of −3.5%. When the air-core coil 60 had an inductance $L_a$ of 5.27 μH (with a percentage of 105.4% against the inductance $L_m$ of the sample 10), the obtained value of the core loss of the sample 10 was 2960 J/m³ with an error of +3.9%. When the air-core coil 60 had an inductance $L_a$ of 5.22 μH (with a percentage of 104.4% against the inductance $L_m$ of the sample 10), the obtained value of the core loss of the sample 10 was 2905 J/m³ with an error of +1.9%. When the air-core coil 60 had an inductance $L_a$ of 5.13 μH (with a percentage of 102.6% against the inductance $L_m$ of the sample 10), the obtained value of the core loss of the sample 10 was 2920 J/m³ with an error of +2.5%. When the air-core coil 60 had an inductance $L_a$ of 5.05 µH (with a percentage of 101.0% against the inductance $L_m$ of the sample 10), the obtained value of the core loss of the sample 10 was 2890 J/m³ with an error of +1.4%. When the air-core coil 60 had an inductance $L_a$ of 5.00 µH (with a percentage of 100.0% against the inductance $L_m$ of the sample 10), the obtained value of the core loss of the sample 10 was 2860 J/m³ with an error of +0.4%. When the air-core coil 60 had an inductance $L_a$ of 4.95 µH (with a percentage of 99.0% against the inductance $L_m$ of the sample 10), the obtained value of the core loss of the sample 10 was 2810 J/m³ with an error of −1.4%. When the air-core coil 60 had an inductance $L_a$ of 4.86 µH (with a percentage of 97.2% against the inductance $L_m$ of the sample 10), the obtained value of the core loss of the sample 10 was 2870 J/m³ with an error of +0.7%. When the air-core coil 60 had an inductance $L_a$ of 4.77 µH (with a percentage of 95.4% against the inductance $L_m$ of the sample 10), the obtained value of the core loss of the sample 10 was 2770 J/m³ with an error of −2.8%. When the air-core coil 60 had an inductance $L_a$ of 4.68 µH (with a percentage of 93.6% against the inductance $L_m$ of the sample 10), the obtained value of the core loss of the sample 10 was 2700 J/m³ with an error of −5.3%. When the air-core coil 60 had an inductance $L_a$ of 4.63 µH (with a percentage of 92.6% against the inductance $L_m$ of the sample 10), the obtained value of the core loss of the sample 10 was 2730 J/m³ with an error of −4.2%. When the air-core coil 60 had an inductance $L_a$ of 4.50 µH (with a percentage of 90.0% against the inductance $L_m$ of the sample 10), the obtained value of the core loss of the sample 10 was 2735 J/m³ with an error of −4.0%.

If an error in a range of ±3.0% is acceptable, a core loss may be measured with a less error when the air-core coil 60 has an inductance La in a range equal to or higher than 4.77 µH and equal to or lower than 5.22 µH. Therefore, when the percentage against the inductance $L_m$ of the sample 10 is approximately equal to or higher than 95.0% and is equal to or lower than 105.0%, a core loss may be measured with a less error.

Figure 8:
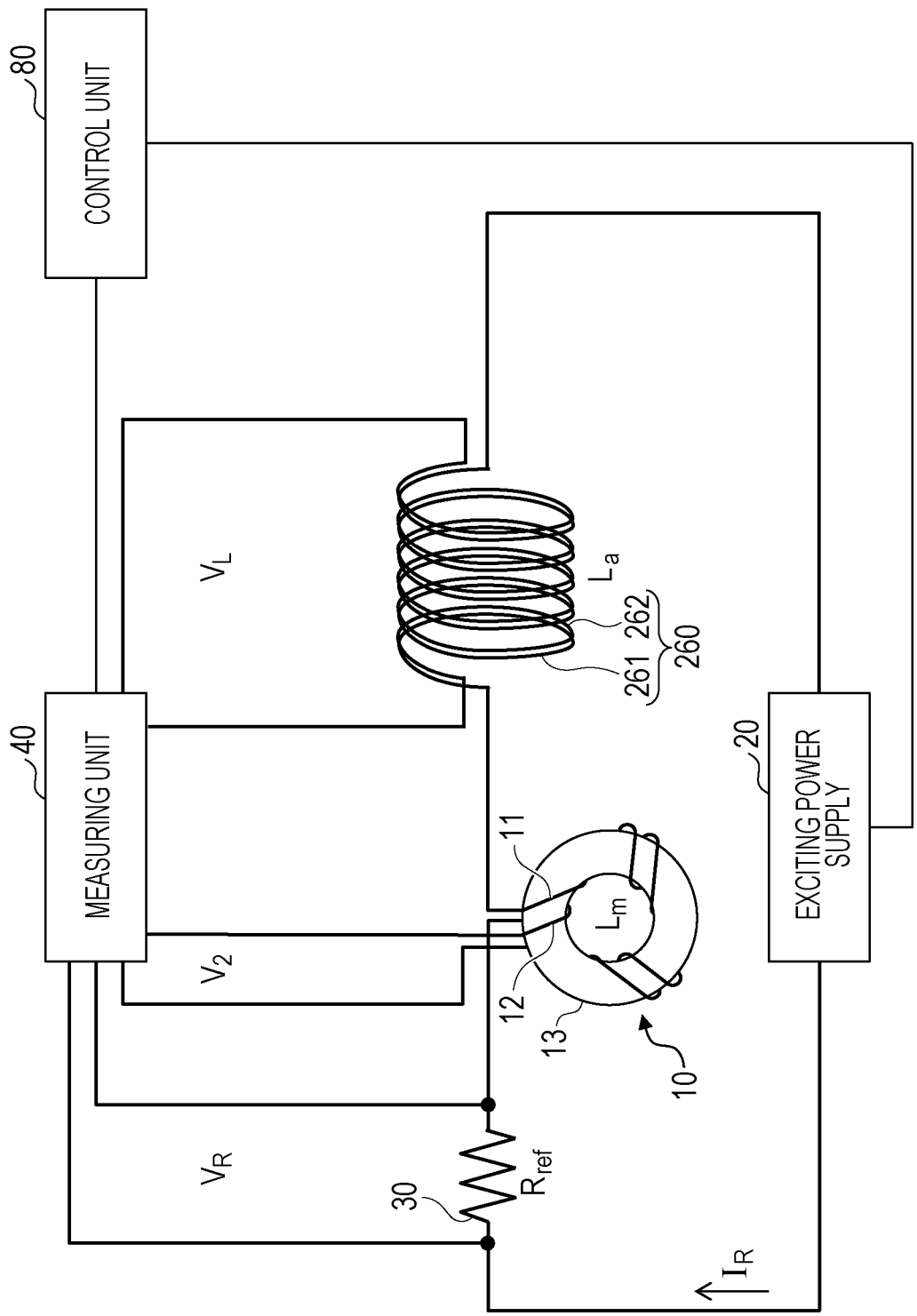
FIG. 8 is an explanatory diagram of a magnetic characteristic measuring apparatus according to a second embodiment.

As illustrated in FIG. 8, when an air-core coil 260 has a value of the inductance $L_a$ that is approximately 0.95 to 1.05 times of the inductance $L_m$ of the sample 10, a core loss may be measured with a less error. The air-core coil 260 and a primary coil 261 and a secondary coil 262 included in the air-core coil 260 are the same as those of the air-core coil 160 except for the value of the inductance $L_a$.

The matters not described above are the same as those according to the first embodiment.

Having described the embodiments, embodiments are not limited to the specific embodiments, and various modifications and changes may be made thereto without departing from the claimed scope.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A magnetic characteristic measuring apparatus measuring a magnetic characteristic of a sample, the apparatus comprising:
   the sample having a first primary coil and a first secondary coil;
   an air-core coil wound by a second primary coil and a second secondary coil, the first primary coil of the sample serially connected to the second primary coil of the air-core coil; and
   a capacitor serially connected to the second primary coil of the air-core coil,
   wherein, in a case where the air-core coil has an inductance $L_a$ at a frequency ω/2π, the capacitor has a capacitance $C_L$ of $\frac{1}{3}\omega^2 L_a \leq C_L \leq 1/\omega^2 L_a$
   wherein the inductance $L_a$ of the air-core coil is 0.95 to 1.05 times of an inductance $L_m$ of the sample.

2. The magnetic characteristic measuring apparatus according to claim 1, further comprising:
   an exciting power supply applying alternating-current voltage to the first primary coil of the sample, the second primary coil of the air-core coil, and the capacitor,
   wherein the alternating-current has a frequency equal to or higher than 1 MHz.

3. The magnetic characteristic measuring apparatus according to claim 1, further comprising:
   a measuring unit measuring a secondary voltage of the first secondary coil of the sample and an induced voltage of the second secondary coil of the air-core coil; and
   a control unit calculating a core loss of the core of the sample based on values of currents flowing through the first primary coil of the sample and the second primary coil of the air-core coil and the secondary voltage and the induced voltage measured by the measuring unit.

4. A magnetic characteristic measuring method measuring a magnetic characteristic of a sample, the method comprising:
   serially connecting a first primary coil of the sample, having the first primary coil and a first secondary coil, to a second primary coil of an air-core coil wound by the second primary coil and a second secondary coil;
   serially connecting a capacitor having a capacitance $C_L$ of $\frac{1}{3}\omega^2 L_a \leq C_L \leq 1/\omega^2 L_a$ to the second primary coil of the air-core coil, wherein $L_a$ is an inductance of the air-core coil at a frequency ω/2π and the $L_a$ is 0.95 to 1.05 times of an inductance $L_m$ of the sample;
   applying alternating-current voltage to the first primary coil of the sample, the second primary coil of the air-core coil, and the capacitor; and
   measuring a secondary voltage of the first secondary coil of the sample and an induced voltage of the second secondary coil of the air-core coil.

* * * * *